(12) United States Patent
Kim

(10) Patent No.: US 11,526,056 B2
(45) Date of Patent: Dec. 13, 2022

(54) DISPLAY DEVICE

(71) Applicant: SAMSUNG DISPLAY CO., LTD., Yongin-si (KR)

(72) Inventor: Jung Hyun Kim, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 64 days.

(21) Appl. No.: 16/751,462

(22) Filed: Jan. 24, 2020

(65) Prior Publication Data

US 2020/0285123 A1   Sep. 10, 2020

(30) Foreign Application Priority Data

Mar. 6, 2019 (KR) ................. 10-2019-0025811

(51) Int. Cl.
*G02F 1/1362* (2006.01)
*G02F 1/1335* (2006.01)
*G02F 1/1333* (2006.01)

(52) U.S. Cl.
CPC .. *G02F 1/136209* (2013.01); *G02F 1/133331* (2021.01); *G02F 1/133512* (2013.01); *G02F 2201/121* (2013.01); *G02F 2201/123* (2013.01); *G02F 2201/501* (2013.01); *G02F 2202/28* (2013.01)

(58) Field of Classification Search
CPC ......... G02F 1/136209; G02F 2201/501; G02F 1/133512; G02F 2202/28; G02F 1/133331
See application file for complete search history.

(56) References Cited

U.S. PATENT DOCUMENTS

| 2017/0064173 | A1* | 3/2017 | Yoo | H04N 5/2351 |
| 2017/0287992 | A1* | 10/2017 | Kwak | H01L 27/3234 |
| 2017/0289324 | A1* | 10/2017 | Yeo | G03B 29/00 |
| 2019/0208044 | A1* | 7/2019 | Lee | H01L 27/3227 |
| 2019/0317629 | A1* | 10/2019 | Jung | G06F 1/1684 |
| 2020/0243794 | A1* | 7/2020 | Jones | H01L 27/3234 |
| 2020/0341306 | A1* | 10/2020 | Shi | G02F 1/1336 |

(Continued)

FOREIGN PATENT DOCUMENTS

| CN | 109100892 A | * | 12/2018 |
| KR | 10-2013-0131017 | | 12/2013 |

(Continued)

*Primary Examiner* — Jia X Pan
(74) *Attorney, Agent, or Firm* — F. Chau & Associates, LLC

(57) ABSTRACT

A display device is described that includes an optical member such as a camera. According to an exemplary embodiment, the display device includes: a substrate that overlaps a light transmission area, a display area that surrounds the light transmission area, and a boundary area that is disposed between the light transmission area and the display area; a first light blocking member that is disposed on the substrate and overlaps the boundary area; a window that overlaps the substrate; and a second light blocking member that is disposed between the first light blocking member and the window, and overlaps the boundary area, wherein the first light blocking member includes a first opening that overlaps the light transmission area, the second light blocking member includes a second opening that overlaps the light transmission area, and a diameter of the first opening is larger than a diameter of the second opening.

19 Claims, 9 Drawing Sheets

(56) References Cited

U.S. PATENT DOCUMENTS

2021/0041737 A1\* 2/2021 Aoki ................... G02F 1/13452
2021/0200020 A1\* 7/2021 Kim ..................... G02F 1/1333

FOREIGN PATENT DOCUMENTS

| KR | 10-2017-0095444 | 8/2017 |
| KR | 10-2018-0014905 | 2/2018 |
| KR | 10-2018-0042351 | 4/2018 |
| KR | 10-2018-0050372 | 5/2018 |

\* cited by examiner

DISPLAY DEVICE

CROSS-REFERENCE TO RELATED APPLICATION

This application claims priority to and the benefit of Korean Patent Application No. 10-2019-0025811 filed in the Korean Intellectual Property Office on Mar. 6, 2019, the entire contents of which are incorporated herein by reference.

BACKGROUND

(a) Field

The present disclosure relates to a display device.

(b) Description of the Related Art

A display device such as a liquid crystal display (LCD), a light emitting diode (LED) display, and the like, may include a display panel that uses a plurality of pixels that can display an image. Each pixel includes a pixel electrode that receives a data signal. The pixel electrode is connected to at least one transistor and receives the data signal from the aforementioned transistor.

In recent years, there has been significant development in display devices with camera functions other than a video display. Conventionally, an optical member, such as a camera or an infrared sensor, exists outside a display area of a display device. Consequentially, the space where a display device can display an image can be reduced.

The above information disclosed in this Background section is for an enhancement of understanding of the background of the disclosure and therefore the disclosure may contain information that does not form the prior art that is already known in this country to a person of ordinary skill in the art.

SUMMARY

Exemplary embodiments have been made in an effort to provide a display including an optical member surrounded by a display area. In particular, a display device of which a peripheral area of an optical member is not viewed by a user is provided.

A display device according to an exemplary embodiment includes: a substrate that overlaps a light transmission area, a display area that surrounds the light transmission area, and a boundary area that is disposed between the light transmission area and the display area; a first light blocking member that is disposed on the substrate and overlaps the boundary area; a window that overlaps the substrate; and a second light blocking member that is disposed between the first light blocking member and the window, and overlaps the boundary area, wherein the first light blocking member includes a first opening that overlaps the light transmission area, the second light blocking member includes a second opening that overlaps the light transmission area, and a diameter of the first opening is larger than a diameter of the second opening.

The first light blocking member may include a first interior edge that forms the first opening, and a first exterior edge, and the first interior edge may overlap the second light blocking member.

The second light blocking member may include a second interior edge that forms the second opening, and a second exterior edge, and the second exterior edge may overlap the first light blocking member.

The first exterior edge may be aligned with an edge of the boundary area.

The second interior edge may be aligned with an edge of the boundary area.

The display device may further include an optical member that overlaps the light transmission area.

A width of the optical member may be smaller than a width of the light transmission area.

A diameter of the optical member may be smaller than a diameter of the second opening.

In the display area, a thin film transistor that is disposed on the substrate; a pixel electrode that is connected with the thin film transistor; a common electrode that overlaps the pixel electrode; and an emission layer that is disposed between the pixel electrode and the common electrode may be disposed.

The display device may further include a partition wall that overlaps at least a part of the pixel electrode, wherein the first light blocking member may be disposed on the partition wall.

At least a part of the common electrode may be disposed on the first light blocking member.

The display device may further include an encapsulation layer that is disposed on the common electrode.

The display device may further include an encapsulation layer that is disposed on the common electrode, wherein the first light blocking member may be disposed on the encapsulation layer.

The substrate may include a through-hole that overlaps the optical member.

The optical member may overlap the substrate.

A display device according to an exemplary embodiment includes: a substrate that overlaps a light transmission area, a display area that surrounds the light transmission area, and a boundary area that is disposed between the light transmission area and the display area; a first light blocking member that is disposed on the substrate and overlaps the boundary area; a window that overlaps the substrate; and a second light blocking member that is disposed between the first light blocking member and the window, and overlaps the boundary area, and an edge of the boundary area overlaps an edge of the first light blocking member and an edge of the second light blocking member.

The first light blocking member may be disposed adjacent to the display area, and the second light blocking member may be disposed adjacent to the light transmission area.

The display device may further include an adhesive layer that is disposed between the first light blocking member and the second light blocking member.

According to the exemplary embodiments, the peripheral area of the optical member, surrounded by the display device can be prevented from being viewed. A display device with improved display quality can be provided.

DETAILED DESCRIPTION OF THE EMBODIMENTS

Figure 1:
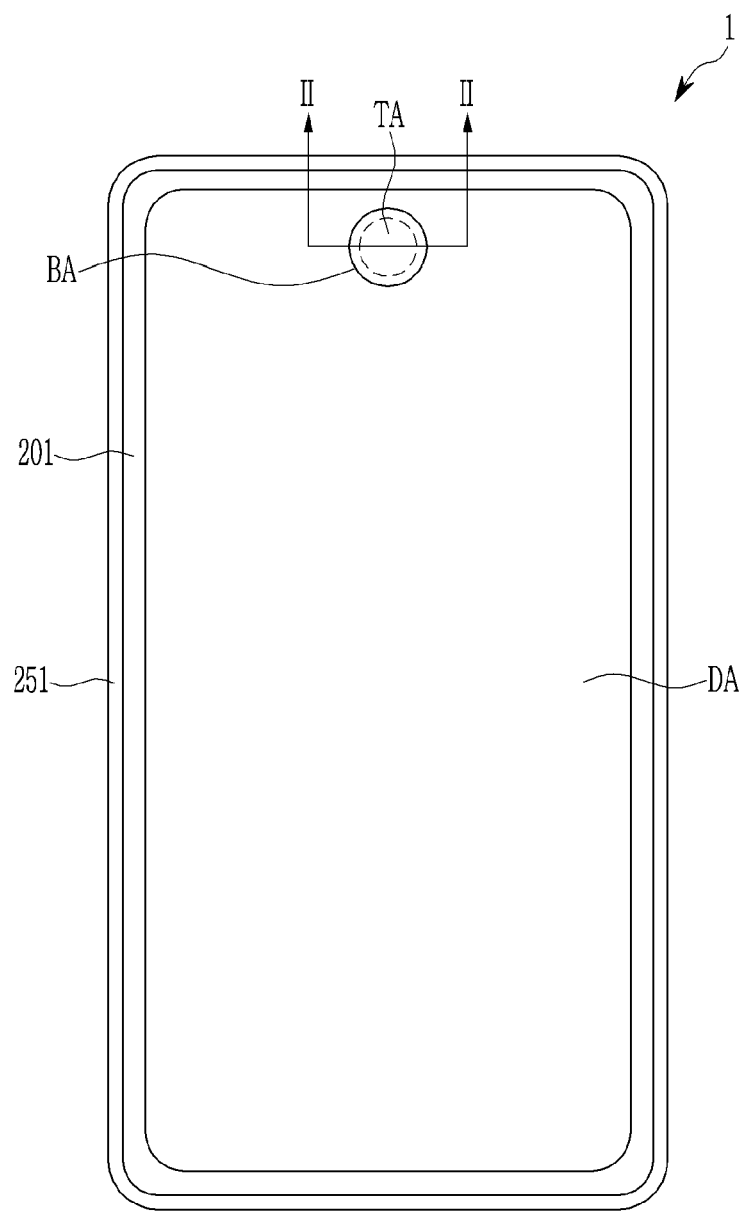
FIG. 1 is a schematic top plan view of a display device according to an exemplary embodiment.

In the following detailed description, certain exemplary embodiments of the present disclosure have been shown and described, simply by way of illustration. As those skilled in the art would realize, the described embodiments may be modified in various different ways, without departing from the spirit or scope of the present disclosure.

Accordingly, the drawings and descriptions are to be regarded as illustrative in nature and not restrictive. Like reference numerals designate like elements throughout the disclosure.

Further, since a size and a thickness of each element illustrated in the drawings are arbitrarily illustrated for convenience of description, the present disclosure is not necessarily limited to those shown in the drawings. In the drawings, the thickness of layers, films, panels, regions, etc., are exaggerated for clarity. In addition, in the drawing, for convenience of description, the thickness of some of layers, films, panels, regions, etc., are exaggerated.

It will be understood that when an element such as a layer, film, region, or substrate is referred to as being "on" another element, the element can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in this disclosure, the phrase "on a plane" means viewing a target portion from the top, and the phrase "on a cross-section" means viewing a cross-section formed by vertically cutting a target portion from the side.

Figure 2:
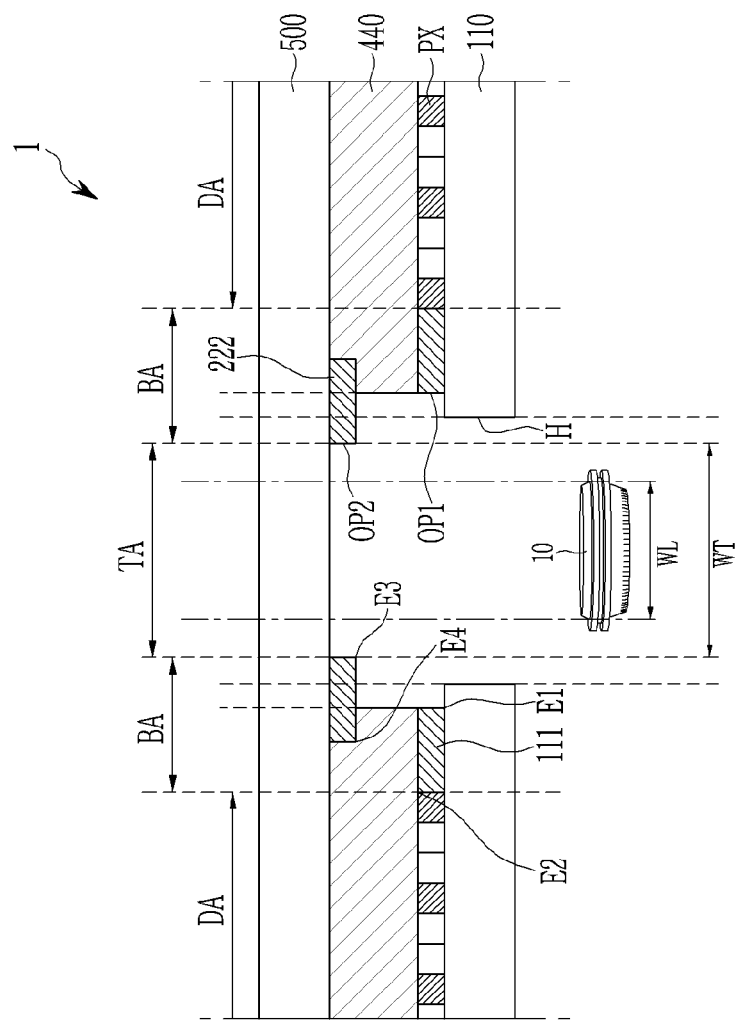
FIG. 2 is a schematic cross-sectional view of the display device, cut along a part of FIG. 1.

A display device according to an exemplary embodiment will now be described with reference to FIG. 1 and FIG. 2. FIG. 1 is a schematic top plan view of a display device according to an exemplary embodiment, and FIG. 2 is a schematic cross-sectional view of the display device, cut along an area of FIG. 1.

First, referring to FIG. 1, a display device 1 according to an exemplary embodiment may include an external buffer area 201, an encapsulation bonding area 251, a display area DA, a light transmission area TA, and a boundary area BA disposed between the display area DA and the light transmission area TA.

The display area DA is an area where a plurality of pixels are arranged and thus an image can be displayed. Each pixel includes a pixel circuit and an emission portion that receives a current from the pixel circuit and emits light.

The light transmission area TA has relatively higher light transmittance than the display area DA or the external buffer area 201, and has no pixels disposed therein, thereby an image is not be displayed. Since light is transmitted in the light transmission area TA, when at least one optical member 10 (refer to FIG. 2) is disposed below the light transmission area TA, light may be incident on the optical member 10 or light may be emitted from the optical member 10. The optical member 10 may be provided as a camera, a flash, a sensor, and the like. Hereinafter, the optical member 10 may be described by using a camera as an example, but this is not restrictive.

The light transmission area TA according to the exemplary embodiment of FIG. 1 may be disposed in the display area DA. The light transmission area TA is surrounded by the plurality of pixels included in the display area DA.

Since the light transmission area TA is larger than each pixel in size, the light transmission area TA is different from a light-transmitting zone formed in each pixel for realization of transparent display. For example, an area where the pixel circuit is formed in each pixel may have a rectangular shape of 25 μm (horizontal)*50 μm (vertical), but the light transmission area TA may have a circular shape having a diameter of 3 mm, but this is not restrictive.

The display device 1 according to the exemplary embodiment may include the boundary area BA disposed between the display area DA and the light transmission area TA. One or more light blocking members that block light may be disposed in the boundary area BA. This will be described in detail with reference to FIG. 2 to FIG. 4.

According to embodiments of the present disclosure, two light blocking members may be disposed in the boundary area BA. The two light blocking members may be configured to prevent light (i.e., light generated by the pixels of the display area DA) from passing through the boundary area BA into the light transmission area TA. This may improve the operation of an optical member such as a camera, by ensuring that the light incident on the optical member (or coming from the optical member) is not mixed with light from the display area DA.

The external buffer area 201 surrounds the display area DA, the light transmission area TA, and the boundary area BA (e.g., the external buffer area 201 may surround the display area DA and the boundary area BA on all four sides in a plane perpendicular to a primary viewing surface of the display device 1). In the exemplary embodiment of FIG. 1, the light transmission area TA is surrounded on all sides by the boundary area BA and the display area DA, and the external buffer area 201 completely surrounds the display area DA.

In some cases, the encapsulation bonding area 251 surrounds, on all sides, the external buffer area 201. The encapsulation bonding area 251 may have an inorganic-inorganic encapsulation bonding structure, bonded with a plurality of inorganic layers. The encapsulation bonding area 251 prevents inflow of moisture into the display area DA from the outside. In addition, an inorganic-inorganic encapsulation adhesive area 251 can be formed using a frit formed of an inorganic material that bonds to an inorganic insulation layer (e.g., a gate insulation layer, etc.) disposed on a substrate 110.

Hereinafter, a cross-sectional structure will be described with reference to FIG. 1 and FIG. 2. FIG. 2 is a simplified view between the substrate 110 and a window 500 included in the display device 1. In FIG. 2, a pixel PX disposed in the display area DA and including a thin film transistor and a light emission element is simply illustrated. The pixel PX will be described in further detail with reference to FIG. 3.

The display device 1 according to the exemplary embodiment may include the display area DA where the plurality of pixels PX are disposed, the light transmission area TA overlapping the optical member 10, and the boundary area BA disposed between the light transmission area TA and the display area DA.

The substrate 110 according to the exemplary embodiment may include a through-hole H that overlaps the light transmission area TA. The through-hole H may also overlap a part of the boundary area BA, but this is not restrictive. The through-hole H may be adjusted depending on a size of the optical member 10.

A first light blocking member 111 that overlaps the boundary area B may be disposed on the substrate 110 and may also be disposed at the periphery of the light transmission area TA and the periphery of the display area DA. The first light blocking member 111 may also prevent light emitted from the pixel PX from being transmitted to the light transmission area TA and may include any material suitable for light blocking.

The first light blocking member 111 may include a first opening OP1 that overlaps the light transmission area TA. However, the first light blocking member 111 may not overlap the light transmission area TA. A planar size of the first opening OP1 may be larger than a planar size of the through-hole H. Additionally, a diameter of the first opening OP1 may be larger than that of the through-hole H and a planar size of the first opening OP1 may be larger than a planar size of the optical member 10. The diameter or a width of the first opening OP1 may be larger than a diameter or a width of the optical member 10.

The first light blocking member 111 includes a first interior edge E1 that forms the first opening OP1, and a first exterior edge E1 that faces the first interior edge E1. The first interior edge E1 may be disposed adjacent to the light transmission area TA, and the first exterior edge E2 may be disposed adjacent to the display area DA. Thus, the first light blocking member 111 may be distinct from the display area DA, but at least a portion of the first light blocking member 111 may be located on a same horizontal plane as the pixel PX.

Although not shown in the drawings, the display device 1 may further include a polarization layer, a touch layer, and the like, which are disposed over the plurality of pixels PX. The polarization layer and the touch layer (not shown) are not disposed in the light transmission area TA and may have an opening corresponding to the light transmission area TA. When the polarization layer and the touch layer (not shown) do not overlap the light transmission area TA, light transmittance of the light transmission area TA may be increased.

An adhesive layer 440 may be disposed between the substrate 110 and the window 500. The adhesive layer 440 enables the substrate 110 and the window 500 to be attached to each other. The adhesive layer 440 may also not be formed in a portion that overlaps the light transmission area TA. However, depending on exemplary embodiments, the optically clear adhesive layer 440 may be formed in the light transmission area TA.

A second light blocking member 222 may be formed above a side of the substrate 110 which faces the window 500, may contact the adhesive layer 440, and may be disposed at the periphery of the light transmission area TA and the periphery of the display area DA. Additionally, the second light blocking member 222 may overlap the boundary area BA, may also prevent light emitted from the pixel PX from being transmitted to the light transmission area TA and may include any suitable material for light blocking. In some cases, the second light blocking member 222 may be located within a same vertical area occupied by the adhesive layer 440 (i.e., such that a top surface of the second light blocking member is parallel to a top surface of the adhesive layer).

The second light blocking member 222 may include a second opening OP2 that overlaps the light transmission area TA. In some examples, the light transmission area is defined by the second opening OP2. Thus, the second light blocking member 222 may not overlap the light transmission area TA. In exemplary embodiments, a planar size of the second opening OP2 may be smaller than a planar size of the through-hole H. A diameter of the second opening OP2 may be smaller than a diameter of the through-hole H. Additionally, the planar size of the second opening OP2 may be larger than a planar size of the optical member 10 located therein. The diameter of the second opening OP2 may be larger than a diameter or a width of the optical member 10.

The second light blocking member 222 may include a second interior edge E3 that forms the second opening OP2, and a second exterior edge E4 that faces the second interior edge E3. The second interior edge E3 may be disposed adjacent to the light transmission area TA, and the second exterior edge E4 may be disposed adjacent to the display area DA.

The first interior edge E1 of the first light blocking member 111 may overlap the second light blocking member 222. Here, the term overlap may refer to overlapping horizontally with respect to the viewing surface of the display device such that a vertical line, perpendicular to the viewing surface, can be extended through both parts). The first exterior edge E2 of the first light blocking member 111 may overlap an edge of the boundary area BA. In some cases, the first exterior edge E2 does not overlap the second light blocking member 222.

The second interior edge E3 of the second light blocking member 222 may overlap the edge of the boundary area BA. The second exterior edge E4 of the second light blocking member 222 may overlap the first light blocking member 111.

Thus, the first light blocking member 111 and at least a part of the second light blocking member 222 may overlap each other. In the present disclosure, an exemplary embodiment in which the first light blocking member 111 and the second light blocking member 222 are partially overlapped with each other is illustrated, but this is not restrictive. Depending on exemplary embodiments, the first interior edge E1 of the first light blocking member 111 and the second exterior edge E4 of the second light blocking member may be aligned. However, the first light blocking member 111 and the second light blocking member 222 may partially overlap with each other in consideration of the process margin.

According to the exemplary embodiment, the boundary area BA is defined through a combination of the first light blocking member 111 and the second light blocking member 222, and accordingly, the light transmission area TA and the display area DA can be distinguished between one-another. For example, an external edge of the boundary area BA (i.e., adjacent to the display area DA) may correspond to the first exterior edge E2 of the first light blocking member 111, and an internal edge of the boundary area BA (i.e., adjacent to the light transmission area TA) may correspond to the second interior edge E3 of the second light blocking member 222.

In addition, a planar width of the second opening OP2 of the second light blocking member 222 may be smaller than that of the first opening OP1 of the first light blocking member 111, and a diameter of the second opening OP2 of the second light blocking member 222 may be smaller than that of the first opening OP1 of the first light blocking member 111.

The first light blocking member 111 and the second light blocking member 222 surround the light transmission area TA.

A width WL of the optical member 10 according to the exemplary embodiment may be smaller than a width WT of the light transmission area TA. When the width WT of the light transmission area TA is equal to or smaller than the width WL of the optical member 10, the optical member 10 may be shielded by the second light blocking member 222 due to misalignment, which may occur during a manufacturing process.

In some embodiments, an air layer (not shown) may be disposed in an opening space between the window 500 and the substrate 110. However, this is not restrictive, and depending on exemplary embodiments, a filling material may be disposed in the opening space. The filling material may be a silicon (Si)-based organic material.

According to the exemplary embodiment, the boundary area BA between the light transmission area TA where the optical member 10 is disposed and the display area DA where the plurality of pixels PX are disposed is blocked by the first light blocking member 111 and the second light blocking member 222. Therefore, the boundary area BA can be prevented from being viewed by a user, and a display device having improved display quality can be provided.

Figure 3:
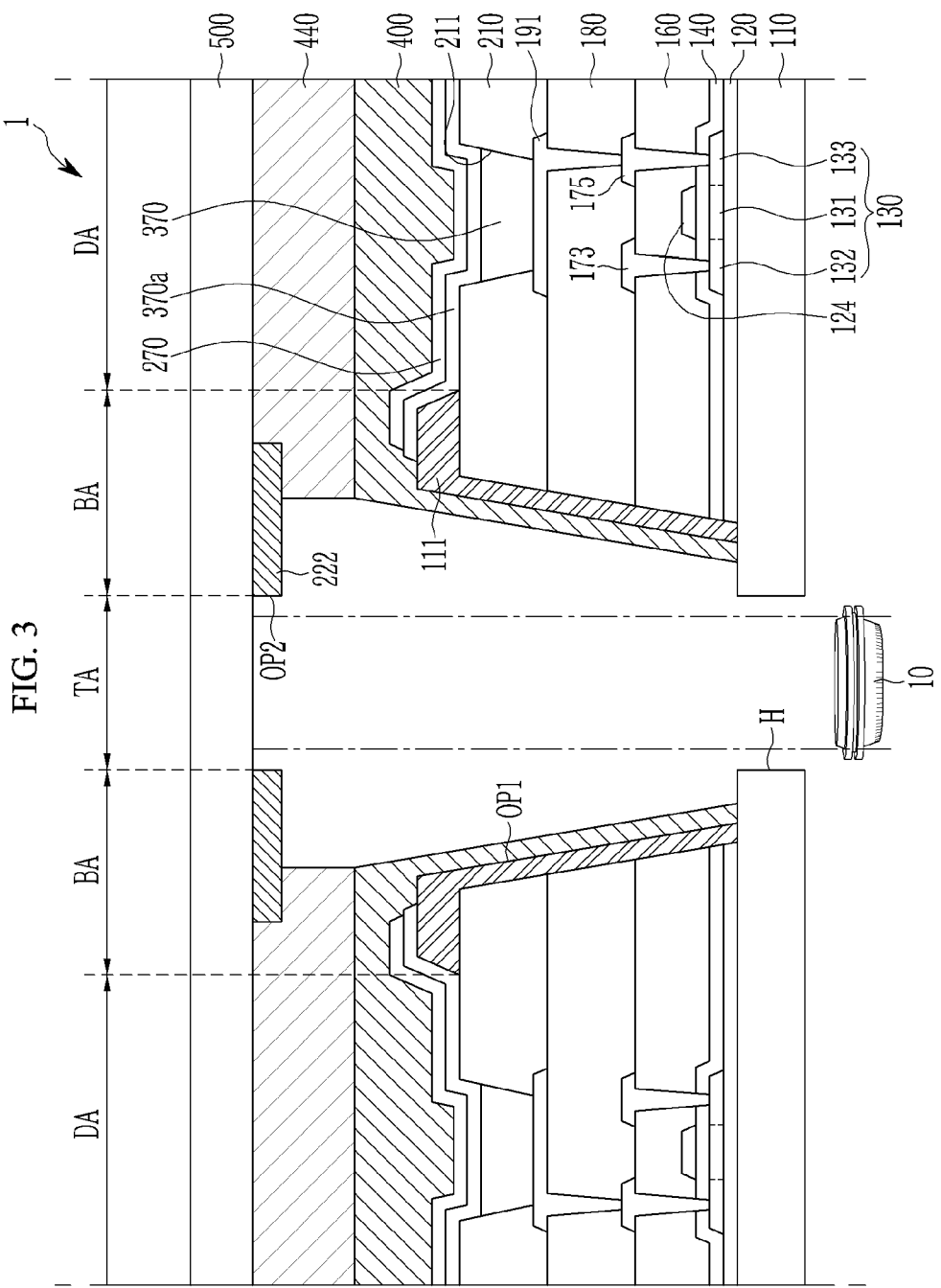
FIG. 3 is a cross-sectional view of an exemplary embodiment of a part of FIG. 2.
Figure 4:
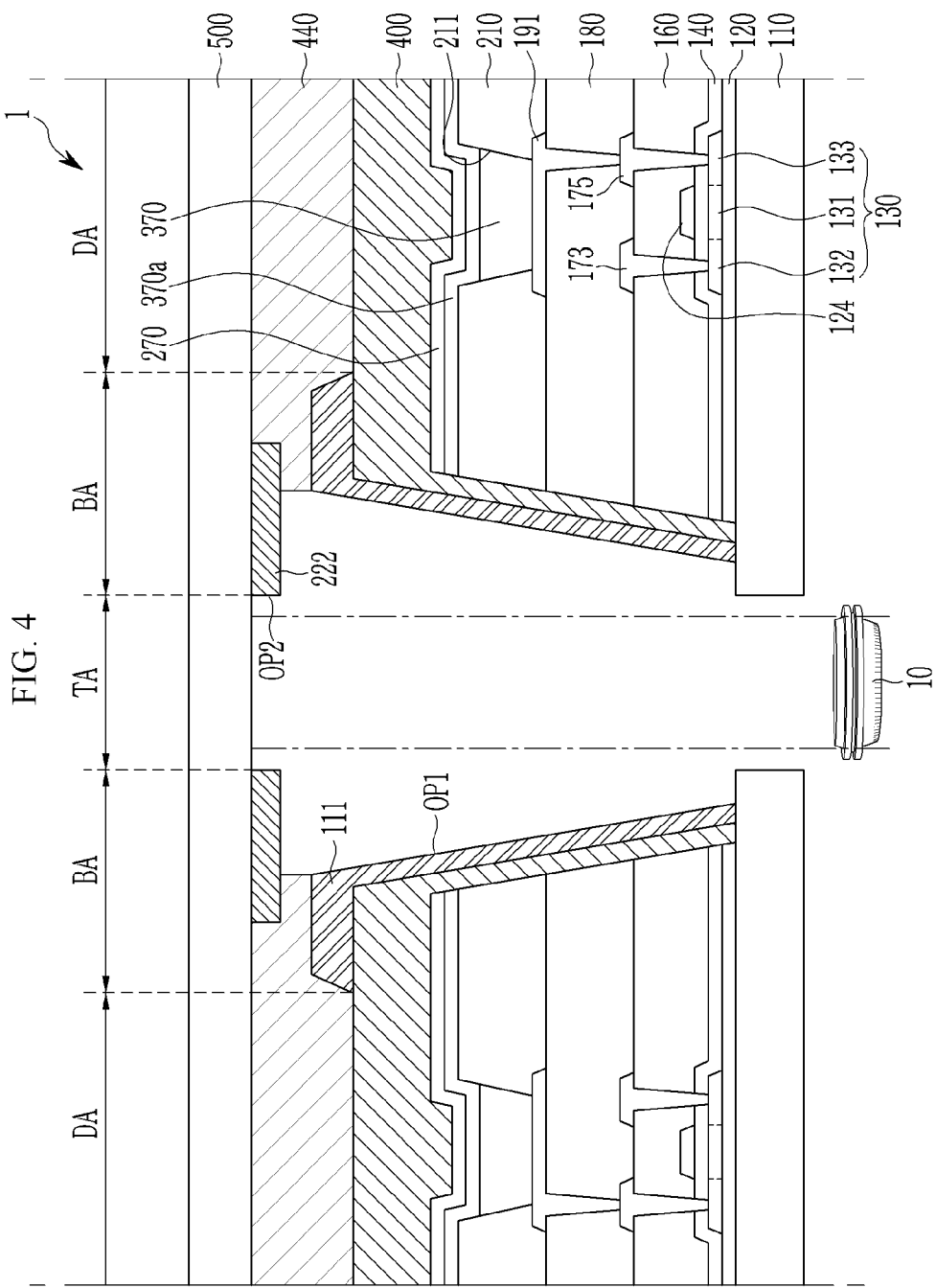
FIG. 4 is a cross-sectional view of an exemplary embodiment of a part of FIG. 2.
Figure 5:
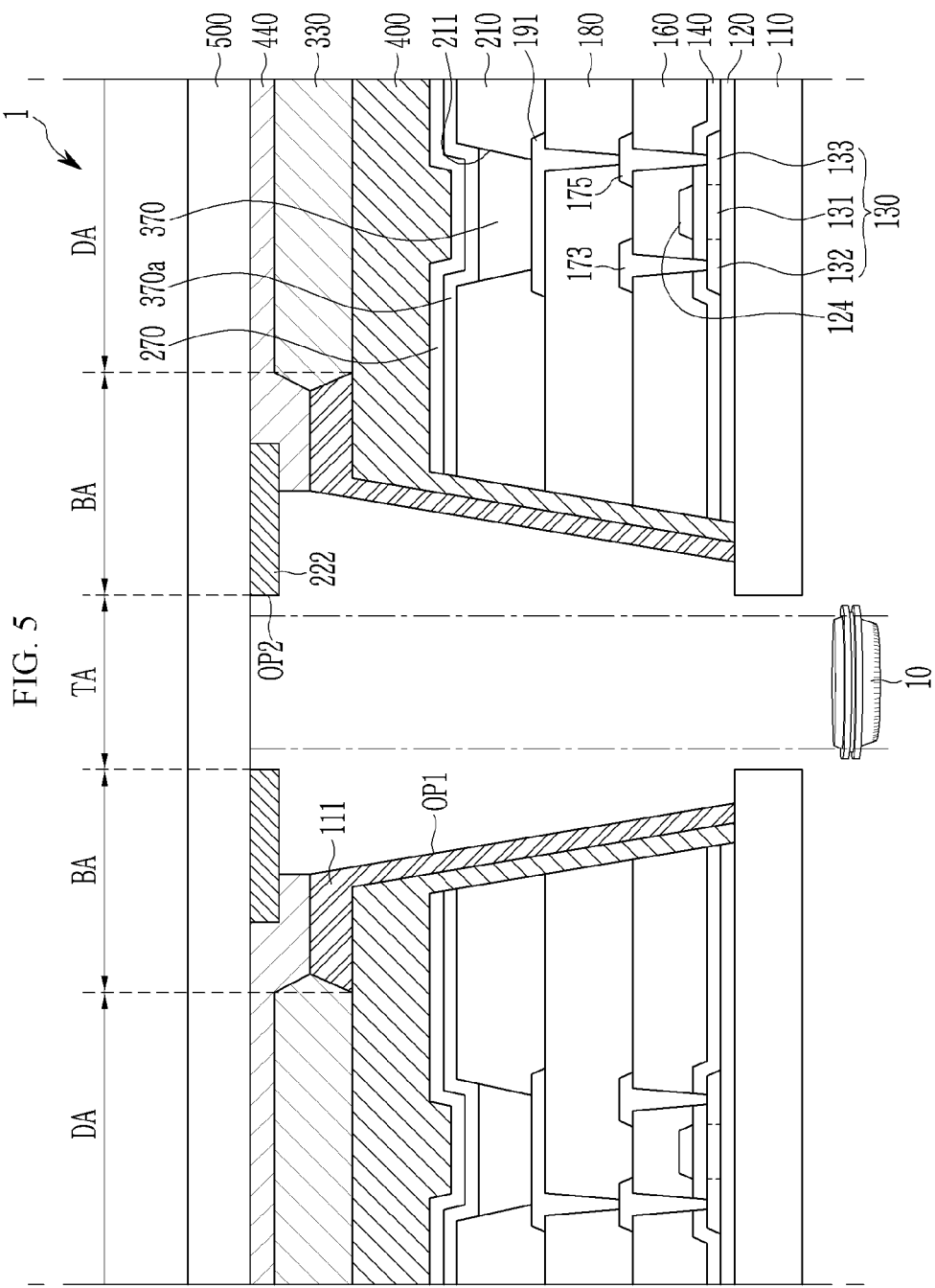
FIG. 5 is a cross-sectional view of an exemplary embodiment of a part of FIG. 2.

Hereinafter, a cross-sectional structure of the display device according to the exemplary embodiment will be described in more detailed with reference to FIG. 3, FIG. 4, and FIG. 5. FIG. 3 is a cross-sectional view of an exemplary embodiment of a part of FIG. 2, FIG. 4 is a cross-sectional view of an exemplary embodiment of a part of FIG. 2, and FIG. 5 is a cross-sectional view of an exemplary embodiment of a part of FIG. 2. The description of the constituent elements overlapping with the above-described constituent elements will be omitted.

First, referring to FIG. 3, a light transmission area TA may overlap a window 500, a through-hole H of a substrate 110, and an optical member 10. Such a light transmission area TA has no opaque layer (a metal layer, a semiconductor layer, etc.) as compared with the display area DA described below, and the number of layers is reduced and accordingly light transmittance is improved by reducing the loss of light occurring at the boundary of the layer.

The optical member 10 is disposed below the substrate 110 in a rear side of the light transmission area TA, and the optical member 10 may be provided as a camera, a flash, a sensor, or the like.

A plurality of pixels are formed in the display area DA, and each pixel includes a pixel circuit and an emission layer that receives a current from the pixel circuit and emits light. The emission layer is divided with reference to a partition wall 210.

The substrate 110 may include a plastic layer and a barrier layer, or may include a glass substrate. The plastic layer and the barrier layer may be alternately stacked.

The plastic layer may include any one selected from a group consisting of polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), poly(arylene ether sulfone), and a combination thereof. The barrier layer may include at least one of a silicon oxide, a silicon nitride, and an aluminum oxide, but this is not restrictive. The barrier layer may include any inorganic material.

A buffer layer 120 is disposed on the substrate 110. The buffer layer 120 may include an inorganic insulation material such as a silicon oxide, a silicon nitride, an aluminum oxide, and the like, or may include an organic insulation material such as polyimide acryl and the like. Depending on exemplary embodiments, the buffer layer 120 may be omitted. The buffer layer 120 may planarize one surface of the substrate 110, or may prevent inflow of moisture or an impurity into an emission layer 370.

A semiconductor layer 130 is disposed on the buffer layer 120. The semiconductor layer 130 may include an amorphous semiconductor, a polycrystalline semiconductor, or an oxide semiconductor.

The semiconductor layer 130 may include a source region 132 connected with a source electrode 173, a drain region 133 connected with a drain electrode 175, and a channel region 131 disposed between the source region 132 and the drain region 133.

A gate insulation layer 140 is disposed on the semiconductor layer 130 and the buffer layer 120 that is not covered by the semiconductor layer 130. The gate insulation layer 140 may also include an inorganic material such as a silicon nitride or a silicon oxide, or an organic insulation material. Here, a silicon nitride includes, for example, SiNx or SiON, and a silicon oxide includes, for example, $SiO_x$.

A gate electrode 124 may be disposed on the gate insulation layer 140. The gate electrode 124 may overlap the channel region 131 of the semiconductor layer 130.

An interlayer insulation layer 160 is disposed on the gate electrode 124 and an exposed portion of the gate insulation layer 140 to cover them. The interlayer insulation layer 160 may include an inorganic insulation material or an organic insulation material.

A source electrode 173 and a drain electrode 175 may be disposed on the interlayer insulation layer 160. The source electrode 173 and the drain electrode 175 are connected with the source region 132 and the drain region 133 of the semiconductor layer 130, respectively, through contact holes of the interlayer insulation layer 160 and the gate insulation layer 140.

A planarization insulation layer 180 may be disposed on the source electrode 173, the drain electrode 175, and portions of the interlayer insulation layer 160 exposed therefrom to cover them. The planarization insulation layer 180 may include an inorganic insulation material or an organic insulation material.

A pixel electrode 191, which is a first electrode, is disposed on the planarization insulation layer 180. The pixel electrode 191 may be connected with the drain electrode 175 through a contact hole of the planarization insulation layer 180.

The partition wall 210 may be disposed on the pixel electrode 191 and the planarization insulation layer 180. The partition wall 210 may overlap at least a part of the pixel electrode 191. The partition wall 210 includes an opening 211 that overlaps the pixel electrode 191. The emission layer 370 is disposed in the opening 211. A common electrode 270 is disposed on the emission layer 370 and the partition wall 210. The pixel electrode 191, the emission layer 370, and the common electrode 270 form a light emitting element.

Depending on exemplary embodiments, the pixel electrode 191 may be an anode, which is a hole injection electrode, and the common electrode 270 may be a cathode, which is an electron injection electrode. On the contrary, the pixel electrode may be a cathode and the common electrode may be anode. A hole and an electron are injected into the light emission layer 370 from the pixel electrode 191 and the common electrode 270 and an exciton formed by coupling the injected hole and electron falls from an excited state to a ground state to emit light.

Depending on exemplary embodiments, an auxiliary layer 370a may be disposed between the common electrode 270 and the emission layer 370. The auxiliary layer 370a may include at least one of an electron transport layer and an electron injection layer, and may be omitted depending on exemplary embodiments. In addition, although an auxiliary layer 370a is not illustrated, at least one of a hole transport layer and a hole injection layer disposed between the pixel electrode 191 and the emission layer 370 may be included. The hole transport layer and the hole injection layer may have the same planar shape as the auxiliary layer 370a.

An encapsulation layer 400 that protects the light emitting element is disposed on the common electrode 270. The encapsulation layer 400 may contact one side of the substrate 110 while contacting the common electrode 270 and the first light blocking member 111 as shown in the drawing.

The encapsulation layer 400 may be a thin film encapsulation layer in which an inorganic layer and an organic layer are stacked and may include a triple layer formed of an inorganic layer, an organic layer, and an inorganic layer. However, the encapsulation layer 400 is not limited thereto and may be formed in the shape of a substrate. Depending on exemplary embodiments, a capping layer and a function layer may be disposed between the second electrode 270 and the encapsulation layer 400.

According to an exemplary embodiment, the first light blocking member 111 may be disposed on the partition wall 210. The first light blocking member 111 may be formed along a side surface of the partition wall 210 from a top surface of the partition wall 210, and may contact the substrate 110. For example, the first light blocking member 111 may contact the top surface of the partition wall 210, a side surface of the planarization insulation layer 180, and a side surface of the interlayer insulation layer 160. Thus, an interior edge of the first light blocking member 111 may extend vertically from the adhesive layer to the substrate 110, whereas an exterior edge of the first light blocking member 111 may not extend down to the substrate 110 but may contact the partition wall 210.

In some cases, the auxiliary layer 370a and the common electrode 270 may overlap the partition wall 210 and a part of the first light blocking member 111 while being disposed on the emission layer 370. A part of the auxiliary layer 370a and a part of the common electrode 270 may be disposed on a top surface of the partition wall 210. A part of the first light blocking member 111 may be disposed between the auxiliary layer 370a, the common electrode 270, and the common electrode 270.

Next, referring to FIG. 4, the first light blocking member 111 may be disposed on the encapsulation layer 400 according to an exemplary embodiment. The first light blocking member 111 may extend to contact the substrate 110, while overlapping a top surface and a side surface of the encapsulation layer 400.

An optically clear adhesive layer 440 and the first light blocking member 111 may be disposed on the encapsulation layer 400. The second light blocking member 222 may be disposed over a portion of the adhesive layer 440, but may be located within the vertical extension of the adhesive layer 440. In some examples, a portion of the adhesive layer 440 may be disposed between the first light blocking member 111 and the second light blocking member 222.

Although the present disclosure has described the position of the first light blocking member 111, the lamination structure can be changed in the range overlapping with the boundary area BA.

Next, referring to FIG. 5, a color filter 330 may be disposed on an encapsulation layer 400 along with a first light blocking member 111. The first light blocking member 111 includes a first opening OP1 that overlaps a light transmission area TA. The color filter 330 may be disposed at a position that overlaps an emission layer 370. In the present exemplary embodiment, the color filter 330 and the first light blocking member 111 are formed on the encapsulation layer 400, but this is not restrictive. Depending on exemplary embodiments, the color filter 330 may be disposed on the encapsulation layer 400 shown in FIG. 3.

According to the exemplary embodiment, the emission layer 370 emits blue light, and the color filter 330 may include a quantum dot that converts a blue light to red light or a quantum dot that converts the blue light to green light or may directly emit incident blue light. Alternatively, emission layers 370 may emit red light, green light, and blue light.

As previously described, the color filter 330 according to the exemplary embodiment may include a quantum dot. A core of the quantum dot may be selected from a combination of a group II-VI compound, a group III-V compound, a group IV-VI compound, a group IV element, a group IV compound, and a combination thereof.

The group II-VI compound may be selected from: a group of two-element compounds selected from CdSe, CdTe, ZnS, ZnSe, ZnTe, ZnO, HgS, HgSe, HgTe, MgSe, MgS, and a mixture thereof; a group of three-element compounds selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a group of four-element compounds selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, but are not limited as such.

The group III-V compound may be selected from: a group of two-element compounds selected from GaN, GaP, GaAs, GaSb, AlN, AlP, AlAs, AlSb, InN, InP, InAs, InSb, and a mixture thereof; a group of three-element compounds selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a group of four-element compounds selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but are not limited as such.

The group IV-VI compound may be selected from: a group of two-element compounds selected from SnS, SnSe, SnTe, PbS, PbSe, PbTe, and a mixture thereof; a group of three-element compounds selected from SnSeS, SnSeTe, SnSTe, PbSeS, PbSeTe, PbSTe, SnPbS, SnPbSe, SnPbTe, and a mixture thereof; and a group of four-element compounds selected from SnPbSSe, SnPbSeTe, SnPbSTe, and a mixture thereof. The group IV element may be selected from a group of Si, Ge, and a mixture thereof. The group IV compound may be a two-element compound selected from a group of SiC, SiGe, and a mixture thereof, but are not limited as such.

In this case, the two-element compound, the three-element compound, or the four-element compound may exist in particles at a uniform concentration or may exist in the same particle divided into states where concentration distributions are partially different. Further, the quantum dot may have a core/shell structure where one quantum dot surrounds another quantum dot. An interface between the core and the shell may have a concentration gradient, such that a concentration of an element existing in the shell is gradually reduced nearing to the center thereof.

In some embodiments, the quantum dot may have a core-shell structure including a core having the above-described nanocrystals and a shell surrounding the core. The shell of the quantum dot can serve as a protective layer for maintaining the semiconductor characteristic and/or as a charging layer for imparting the electrophoretic characteristic to the quantum dot by preventing chemical denaturation of the core. The shell may be a single layer or multiple layers. An interfacing surface between the core and the shell may have a concentration gradient in which a concentration of an element decreases closer to its center. The shell of the quantum dot may include a metal or non-metal oxide, a semiconductor compound, or a combination thereof.

For example, the metal or non-metal oxide may exemplary include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, or a three-element compound such as $MgAl_2O_4$, $CoFe_2O_4$, $NiFe_2O_4$, $CoMn_2O_4$, and the like, but are not limited as such.

In addition, the semiconductor compound may exemplary include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but are not limited as such.

The quantum dot may have a full width of half maximum (FWHM) of a light emission wavelength spectrum of less than about 45 nm; color purity or color reproducibility can be improved within a range of about 40 nm to 30 nm. Also, light emitted through the quantum dots is emitted in multiple directions, so that a wide viewing angle can be improved.

In addition, shapes of the quantum dots are not limited to shapes that are generally used in the related art; and a nanoparticle having a spherical, pyramidal, multi-arm, or cubic shape, a nanotube, a nanowire, a nanofiber, and a planar nanoparticle, to be used.

Quantum dots have the ability to control the color of emitted light according to the particle size, and thus the quantum dots can have various luminescent hues such as blue, red, and green.

The adhesive layer 440 may be disposed between the color filter 330 and the window 500 and between the first light blocking member 111 and the window 500. Descriptions of the same constituent elements as those of the above-mentioned constituent elements may be omitted.

Figure 6:
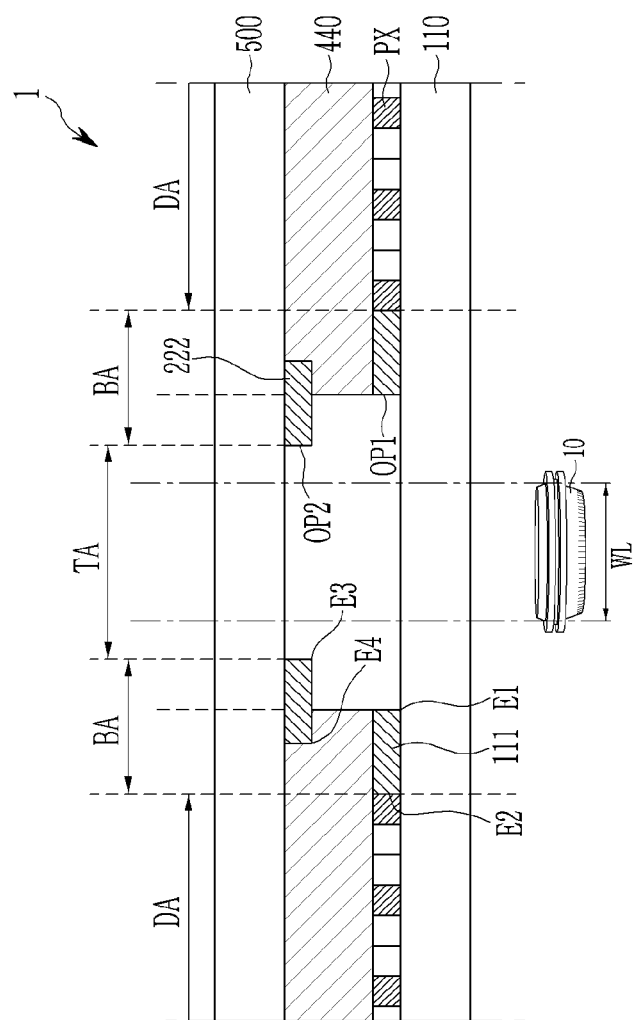
FIG. 6 is a schematic cross-sectional view of a display device cut along a part of FIG. 1.

Hereinafter, a display device according to an exemplary embodiment will be described with reference to FIG. 6. FIG. 6 is a schematic cross-sectional view of a display device, cut along a part of FIG. 1. Description of the same components as those of the above-described components will be omitted.

First, referring to FIG. 6, a light transmission area TA has a non-hole structure. In case of a through-hole structure, a through-hole is formed in a substrate 110 included in a display device 1, but in case of the non-hole structure, the substrate 110 does not include a through-hole. Thus, the light transmission area TA may overlap the substrate 110 and an optical member 10.

Since the light transmission area TA is larger than a single pixel in size, the light transmission area TA is different from a light-transmitting zone that is formed in a pixel for realization of transparent display. For example, an area in a pixel in which a pixel circuit is formed, may have a rectangular shape of 25 μm (horizontal)*50 μm (vertical), but the light transmission area TA may have a circular structure having a diameter of 3 mm.

Figure 7:
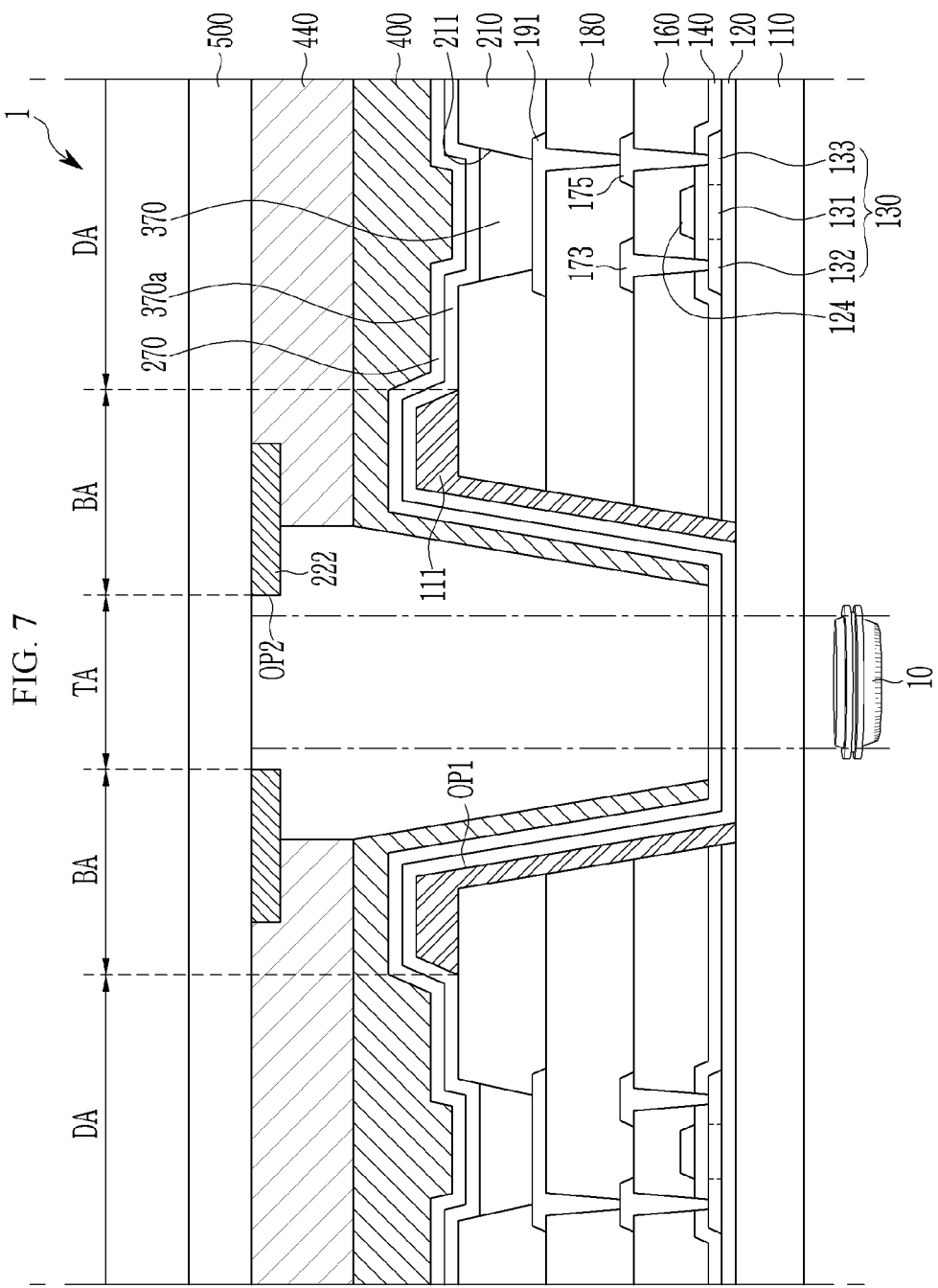
FIG. 7 is a cross-sectional view of an exemplary embodiment of a part of FIG. 6.
Figure 8:
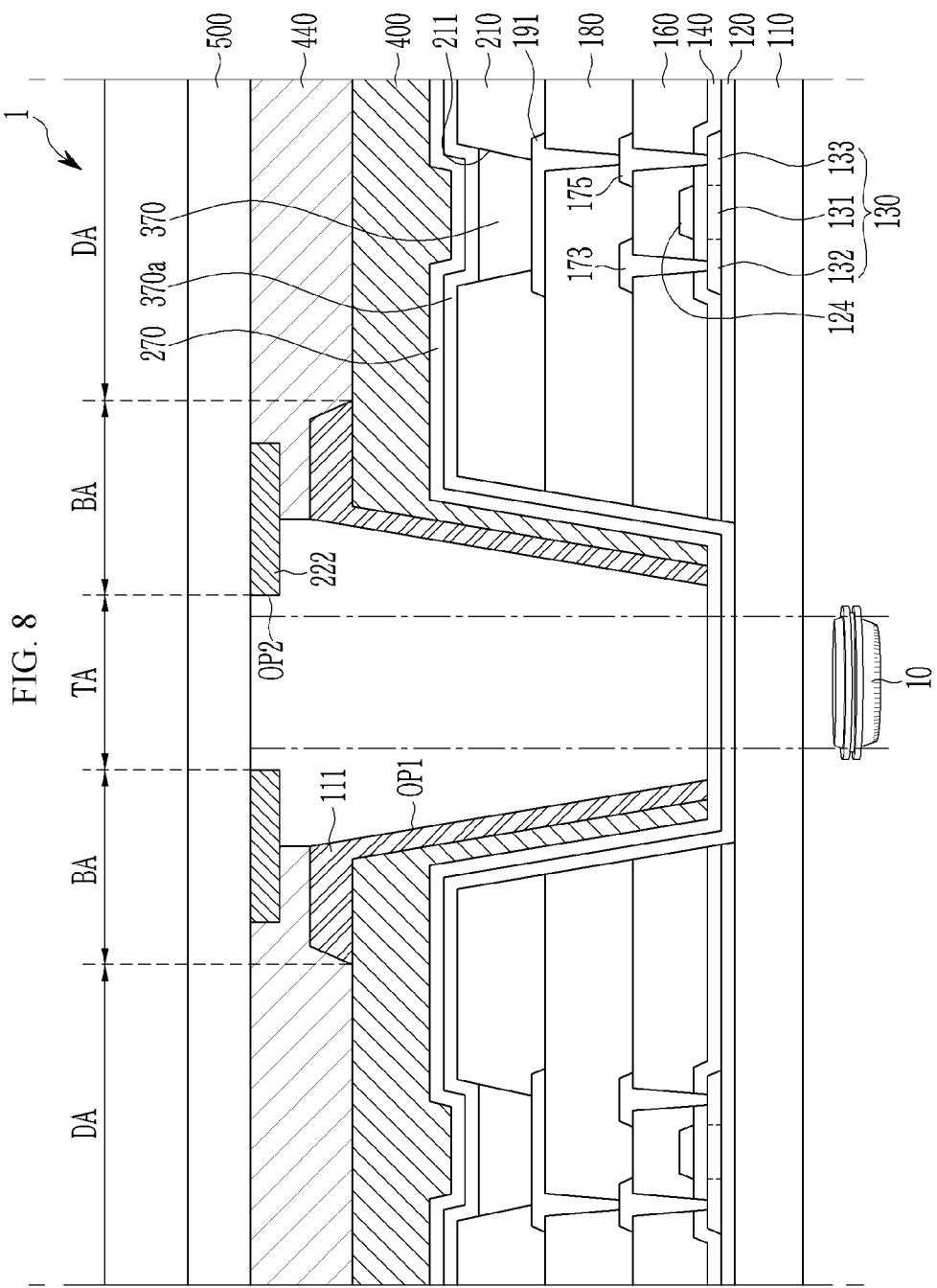
FIG. 8 is a cross-sectional view of an exemplary embodiment of a part of FIG. 6.
Figure 9:
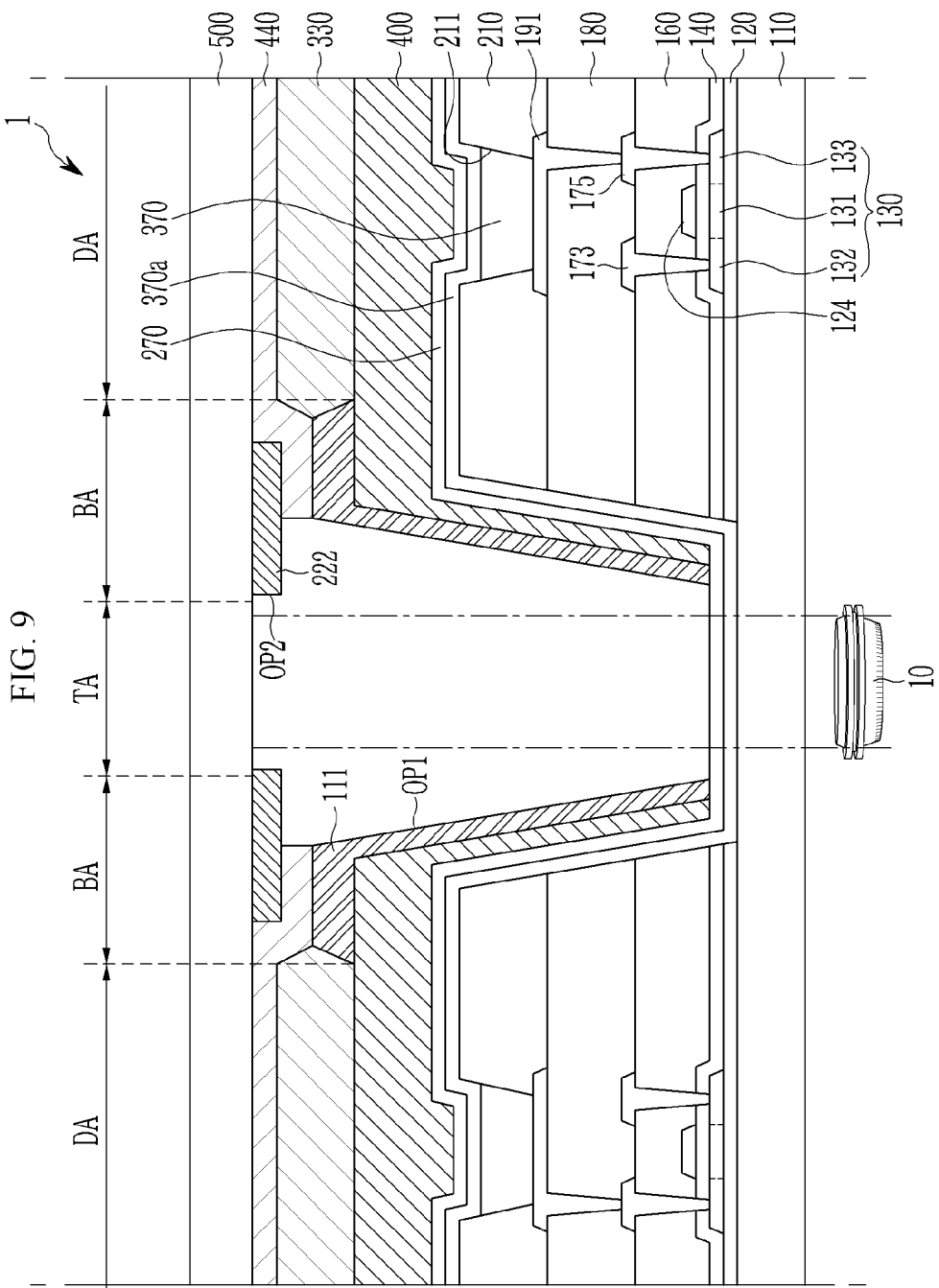
FIG. 9 is a cross-sectional view of an exemplary embodiment of a part of FIG. 6.

Next, a cross-sectional view of a display device according to an exemplary embodiment will be described with reference to FIG. 7 to FIG. 9. FIG. 7 is a cross-sectional view of an exemplary embodiment of a part of FIG. 6, FIG. 8 is a cross-sectional view of an exemplary embodiment of a part of FIG. 6, and FIG. 9 is a cross-sectional view of an exemplary embodiment of a part of FIG. 6.

First, referring to FIG. 7, a light transmission area TA may overlap a substrate 110, an auxiliary layer 370a that forms a light emitting element, a common electrode 270, an air layer, and a window 500. Depending on exemplary embodiments, the common electrode 270 may be omitted, and at least one of a buffer layer 120 and a gate insulation layer 140 may be disposed.

A first light blocking member 111 may be disposed on a partition wall 210 and may contact of a side of at least one of a planarization insulation layer 180, an interlayer insulation layer 160, a gate insulation layer 140, and a buffer layer 120, while overlapping a top surface of the partition wall 210. The first light blocking member 111 may also extend to one side of the substrate 110.

In addition, the auxiliary layer 370a and the common electrode 270 may overlap a display area DA, a boundary area BA, and a light transmission area TA. The auxiliary layer 370a and the common electrode 270 may extend to the boundary area BA from the display area DA and may overlap a side surface and a top surface of the first light blocking member 111, disposed in the boundary area BA.

Next, referring to FIG. 8, a light transmission area TA may overlap a substrate 110, an auxiliary layer 370a that forms a light emitting element, a common electrode 270, an air layer, and a window 500. Depending on exemplary embodiments, the common electrode 270 may be omitted, and at least one of a buffer layer 120 and a gate insulation layer 140 may be disposed.

A first light blocking member 111 may be disposed on an encapsulation layer 400 and may extend toward the substrate 110 while overlapping a top surface and a side surface of the encapsulation layer 400. Additionally, the first light blocking member 111 may be disposed between the encapsulation layer 400 and an adhesive layer 440.

Next, referring to FIG. 9, a light transmission area TA may overlap a substrate 110, an auxiliary layer 370a that forms a light emitting element, a common electrode 270, an air layer, and a window 500. Depending on exemplary embodiments, the common electrode 270 may be omitted, and at least one of a buffer layer 120 and a gate insulation layer 140 may be disposed.

A color filter 330 and a first light blocking member 111 may be disposed on an encapsulation layer 400. The first light blocking member 111 includes a first opening that overlaps the light transmission area TA. The color filter 330 may be disposed at a position overlapping the emission layer 370. In the present exemplary embodiment, the color filter 330 and the first light blocking member 111 are formed on the encapsulation layer 400, but this is not restrictive.

Depending on exemplary embodiments, the color filter 330 may be disposed on the encapsulation layer 400 shown in FIG. 7.

According to the exemplary embodiment, the emission layer 370 emits blue light, and the color filter 330 may include a quantum dot that converts blue light to red light or a quantum dot that converts the blue light to green light, or may directly emit an incident blue light. Alternatively, emission layers 370 may emit red light, green light, and blue light.

The color filter 330 according to the exemplary embodiment may include a quantum dot. A core of the quantum dot may be selected from a combination of a group II-VI compound, a group III-V compound, a group IV-VI compound, a group IV element, a group IV compound, and a combination thereof.

An adhesive layer 440 may be disposed between the color filter 330 and the window 500 and between the first light blocking member 111 and the window 500. Descriptions of the same constituent elements as those of the above-mentioned constituent elements are omitted.

While this disclosure has been described in connection with what is presently considered to be practical exemplary embodiments, it is to be understood that the disclosure is not limited to the disclosed embodiments. On the contrary, it is intended to cover various modifications and equivalent arrangements included within the spirit and scope of the appended claims.

DESCRIPTION OF SYMBOLS

TA: light transmission area
DA: display area
BA: boundary region
OP1: first opening
OP2: second opening
111: first light blocking member
222: second light blocking member
500: window

What is claimed is:

1. A display device comprising: a substrate that overlaps a light transmission area, a display area that surrounds the light transmission area, and a boundary area that is disposed between the light transmission area and the display area;
   a planarization insulation layer and an interlayer insulation layer overlapping the boundary area and the display area;
   an auxiliary layer disposed on the planarization insulation layer and comprising an electron transport layer and an electron injection layer;
   a first light blocking member that is disposed on the substrate and overlaps the boundary area;
   a window that overlaps the substrate; and
   a second light blocking member that is disposed between the first light blocking member and a bottom surface of the window, and overlaps the boundary area,
   wherein the first light blocking member comprises a first opening that overlaps the light transmission area,
   the second light blocking member comprises a second opening that overlaps the light transmission area, and
   a diameter of the first opening is larger than a diameter of the second opening,
   the first light blocking member comprises a first part disposed on side surfaces of the planarization insulation layer and the interlayer insulation layer and a second part disposed on a top surface of the planarization insulation layer and the interlayer insulation layer, and the second part of the first light blocking member overlaps at least one of the electron transport layer and the electron injection layer in a plan view.

2. The display device of claim 1, wherein the first light blocking member comprises a first interior edge that forms the first opening, and a first exterior edge, and the first interior edge overlaps the second light blocking member.

3. The display device of claim 1, wherein the second light blocking member comprises a second interior edge that forms the second opening, and a second exterior edge, and the second exterior edge overlaps the first light blocking member.

4. The display device of claim 2, wherein the first exterior edge is aligned with an edge of the boundary area.

5. The display device of claim 3, wherein the second interior edge is aligned with an edge of the boundary area.

6. The display device of claim 1, further comprising an optical member that overlaps the light transmission area.

7. The display device of claim 6, wherein a width of the optical member is smaller than a width of the light transmission area.

8. The display device of claim 6, wherein a diameter of the optical member is smaller than the diameter of the second opening.

9. The display device of claim 1, further comprising, in the display area,
   a thin film transistor that is disposed on the substrate;
   a pixel electrode that is connected with the thin film transistor;
   a common electrode that overlaps the pixel electrode; and
   an emission layer that is disposed between the pixel electrode and the common electrode are disposed.

10. The display device of claim 9, further comprising a partition wall that overlaps at least a part of the pixel electrode, wherein the first light blocking member is disposed on the partition wall.

11. The display device of claim 10, wherein at least a part of the common electrode is disposed on the first light blocking member.

12. The display device of claim 11, further comprising an encapsulation layer that is disposed on the common electrode.

13. The display device of claim 9, further comprising an encapsulation layer that is disposed on the common electrode.

14. The display device of claim 6, wherein the substrate comprises a through-hole that overlaps the optical member.

15. The display device of claim 6, wherein the optical member overlaps the substrate.

16. A display device comprising:
   a substrate that overlaps a light transmission area, a display area that surrounds the light transmission area, and a boundary area that is disposed between the light transmission area and the display area;
   an auxiliary layer disposed on the substrate and comprising an electron transport layer and an electron injection layer;
   an encapsulation layer disposed on the substrate and overlapping the display area and the boundary area;
   a first light blocking member that is disposed on the substrate and overlaps the boundary area;

a window that overlaps the substrate; and a second light blocking member that is disposed between the first light blocking member and the window, and overlaps the boundary area, wherein the first light blocking member comprises a first edge and a second edge, and the first edge of the first light blocking member is disposed facing to the light transmission area, the second light blocking member comprises a third edge and a fourth edge, and the third edge of the second light blocking member is disposed adjacent to the light transmission area, and a first edge of the boundary area and the second edge of the first light blocking member are aligned with each other, a second edge of the boundary area and the third edge of the second blocking member are aligned with each other, and the fourth edge of the second light blocking member is offset from the second edge of the first light blocking member and the second edge of the boundary area, the first light blocking member comprises a first part disposed on a side surface of the encapsulation layer and a second part disposed on a top surface of the encapsulation layer, and the second part of the first light blocking member overlaps at least one of the electron transport layer and the electron injection layer in a plan view.

17. The display device of claim 16, wherein the first light blocking member comprises a first opening, the second light blocking member comprises a second opening, and a width of the first opening is larger than a width of the second opening.

18. The display device of claim 16, wherein the first light blocking member is disposed adjacent to the display area, and the second light blocking member is disposed adjacent to the light transmission area.

19. The display device of claim 16, further comprising an adhesive layer that is disposed between the first light blocking member and the second light blocking member.

* * * * *